US012677428B2

(12) United States Patent
Ogino et al.

(10) Patent No.: US 12,677,428 B2
(45) Date of Patent: Jul. 7, 2026

(54) METAL INSULATOR METAL CAPACITOR (MIM CAPACITOR)

(71) Applicant: INTERNATIONAL BUSINESS MACHINES CORPORATION, Armonk, NY (US)

(72) Inventors: Atsushi Ogino, Fishkill, NY (US); Baozhen Li, South Burlington, VT (US); Dureseti Chidambarrao, Weston, CT (US); Matthew Stephen Angyal, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 447 days.

(21) Appl. No.: 18/455,665

(22) Filed: Aug. 25, 2023

(65) Prior Publication Data

US 2025/0072017 A1     Feb. 27, 2025

(51) Int. Cl.
| | |
|---|---|
| *H10D 1/68* | (2025.01) |
| *H10W 20/40* | (2026.01) |

(52) U.S. Cl.
CPC .......... *H10D 1/696* (2025.01); *H10W 20/496* (2026.01)

(58) Field of Classification Search
CPC ... H10D 84/204; H10D 84/212; H10D 84/217
See application file for complete search history.

(56) References Cited

U.S. PATENT DOCUMENTS

| | | | |
|---|---|---|---|
| 9,391,016 | B2 | 7/2016 | Shen |
| 9,627,312 | B2 | 4/2017 | Childs |
| 10,211,147 | B2 | 2/2019 | Zhang |
| 10,256,231 | B2 | 4/2019 | Cheng |
| 10,734,473 | B2 | 8/2020 | Cheng |
| 10,734,475 | B2 | 8/2020 | Ando |
| 11,056,556 | B2 | 7/2021 | Shen |
| 11,437,331 | B2 | 9/2022 | Huang |
| 2013/0270675 | A1 | 10/2013 | Childs |
| 2021/0118829 | A1* | 4/2021 | Huang ................... H01L 24/03 |
| 2022/0140070 | A1 | 5/2022 | Hakamo |
| 2023/0268380 | A1* | 8/2023 | Leng ..................... H10D 1/716 257/534 |

* cited by examiner

*Primary Examiner* — Errol V Fernandes
(74) *Attorney, Agent, or Firm* — Kristofer Haggerty

(57) ABSTRACT

A MIM capacitor including a bottom metal layer on a substrate, a first contact window in the bottom metal layer; and a first dielectric spacer disposed within the first contact window on vertical sidewalls of the bottom metal layer, where the first dielectric spacer has a rounded upper surface, where a bottom most surface of the bottom metal layer is substantially flush with a bottom most surface of the first insulator layer. A method including forming a bottom metal layer on a substrate, forming a first contact window in the bottom metal layer, and forming a first dielectric spacer disposed within the first contact window on vertical sidewalls of the bottom metal layer, wherein the first dielectric spacer has a rounded upper surface.

20 Claims, 12 Drawing Sheets

100

Section X-X

Section X-X

Section X-X

Section X-X

Section X-X

Section X-X

Section X-X

Section X-X

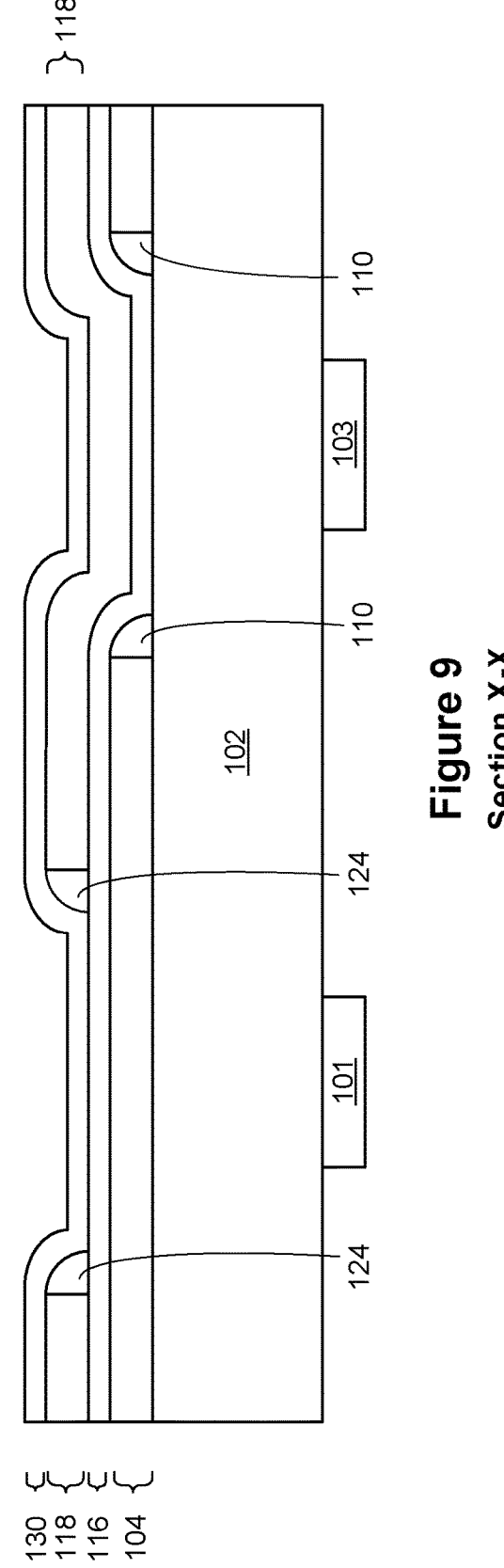
Figure 9
Section X-X

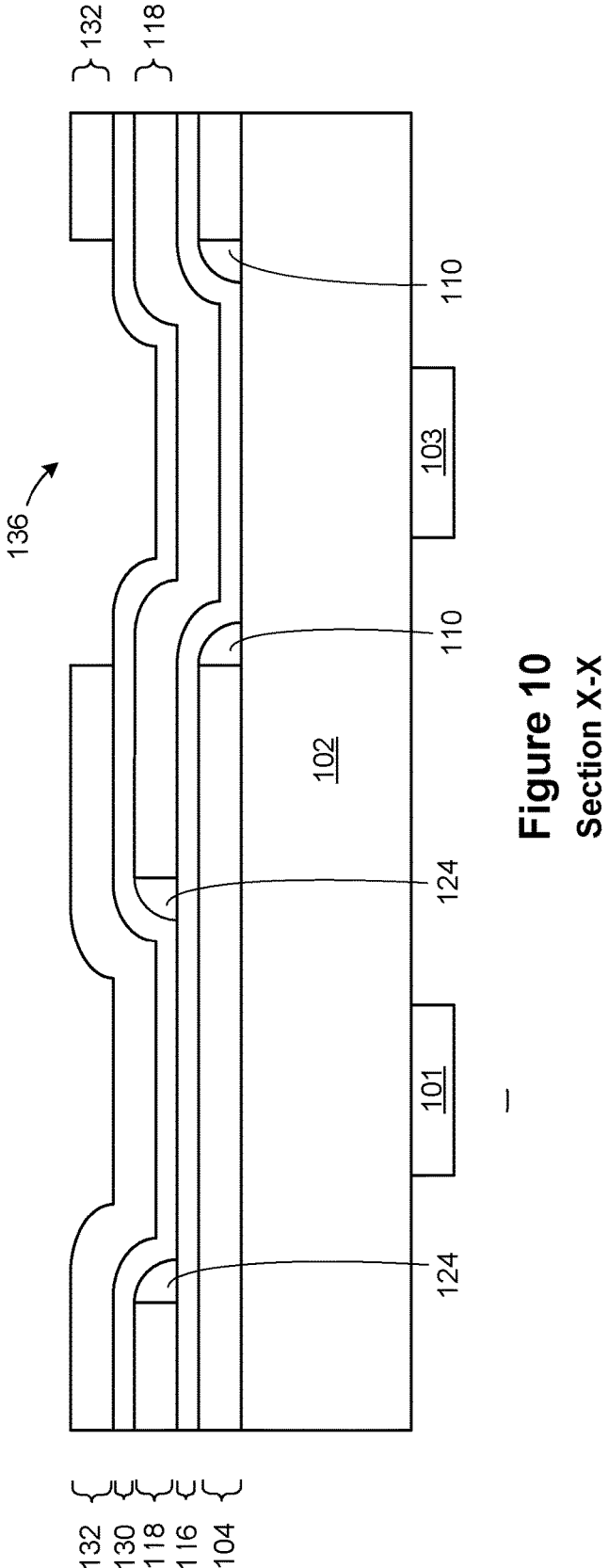
Figure 10
Section X-X

Section X-X

100

METAL INSULATOR METAL CAPACITOR (MIM CAPACITOR)

BACKGROUND

The present invention relates, generally, to the field of semiconductor manufacturing, and more particularly to a metal insulator metal (MIM) capacitor.

MIM capacitors are a key element for integration of system-on-chips, improving both circuit performance and down-scaling capability. A typical MIM capacitor includes an outer electrode, a dielectric/insulator layer and an inner electrode. Voltage is applied across the electrodes which results in charge storage within the formed capacitor configuration. MIM capacitors are used in functional circuits such as mixed signal circuits, analog circuits, radio frequency (RF) circuits, dynamic random access memory (DRAM), embedded DRAM, and logic operation circuits. In general, for a MIM capacitor in an RF application, a dielectric loss must be extremely small, and a series resistance of the wiring should be minimized for high frequency applications. This indicates that it is desirable to use short interconnect wires with a low specific resistance. A MIM capacitor integrated in back end of line (BEOL) metallization is suitable to fulfill these requirements.

SUMMARY

According to an embodiment of the present invention, a metal insulator metal capacitor (MIM capacitor) is provided. The MIM capacitor including a bottom metal layer on a substrate, a first contact window in the bottom metal layer, and a first dielectric spacer disposed within the first contact window on vertical sidewalls of the bottom metal layer, where the first dielectric spacer has a rounded upper surface.

According to an embodiment of the present invention, a metal insulator metal capacitor (MIM capacitor) is provided. The MIM capacitor including a bottom metal layer on a substrate, a first contact window in the bottom metal layer; and a first dielectric spacer disposed within the first contact window on vertical sidewalls of the bottom metal layer, where the first dielectric spacer has a rounded upper surface, where a bottom most surface of the bottom metal layer is substantially flush with a bottom most surface of the first insulator layer.

According to an embodiment of the present invention, a method is provided. The method including forming a bottom metal layer on a substrate, forming a first contact window in the bottom metal layer, and forming a first dielectric spacer disposed within the first contact window on vertical sidewalls of the bottom metal layer, wherein the first dielectric spacer has a rounded upper surface.

BRIEF DESCRIPTION OF THE DRAWINGS

The following detailed description, given by way of example and not intended to limit the invention solely thereto, will best be appreciated in conjunction with the accompanying drawings, in which:

FIG. 9 illustrates a cross-sectional view of the semiconductor structure along section line X-X and illustrates formation of a formation of a second insulator, according to an exemplary embodiment;

FIG. 10 illustrates a cross-sectional view of the semiconductor structure along section line X-X and illustrates formation of a top metal layer, according to an exemplary embodiment;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
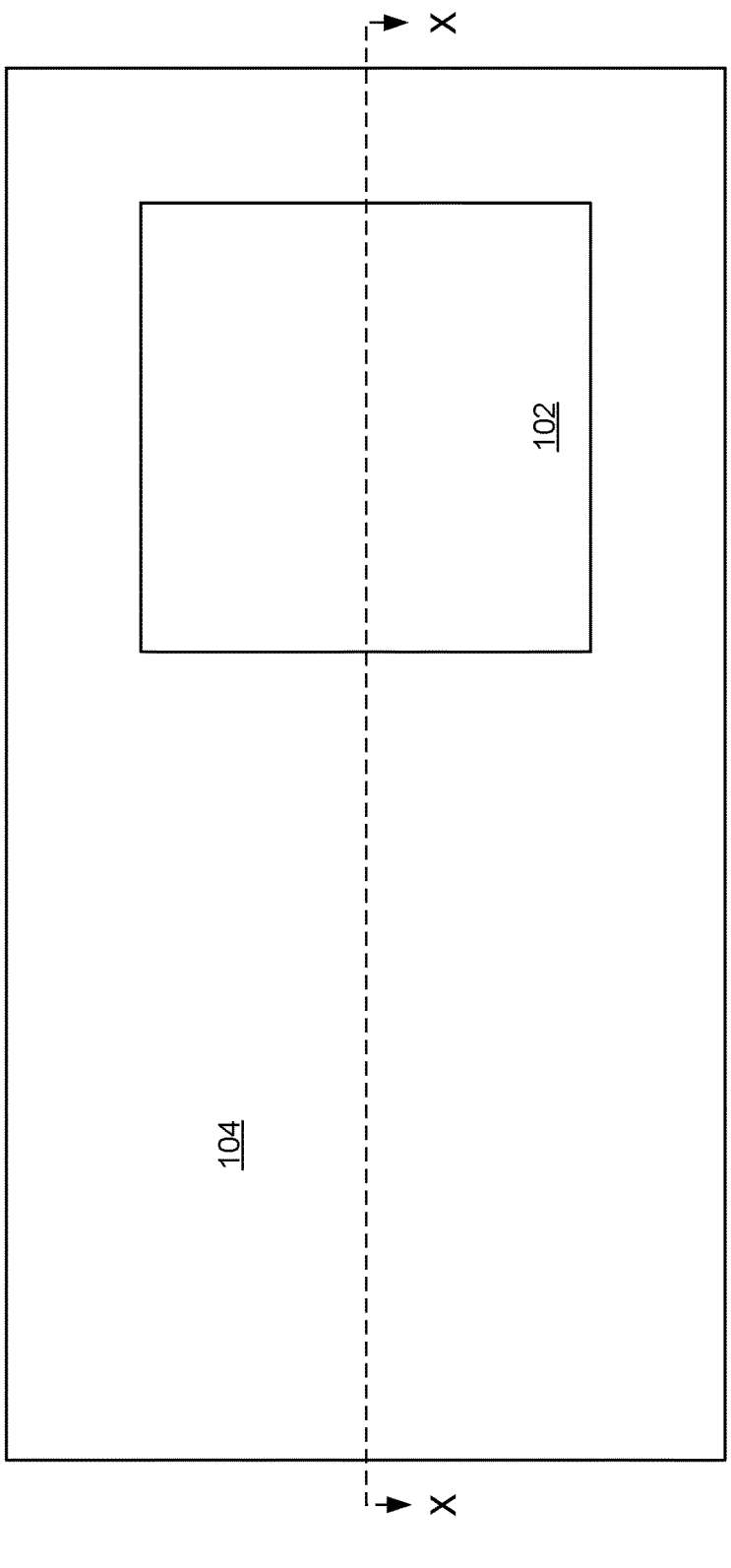
FIG. 1 illustrates a top view of a semiconductor structure, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates, generally, to the field of semiconductor manufacturing, and more particularly to a metal-insulator-metal (MIM) capacitor.

There is a high demand for on chip capacitors, such as MIM capacitors, in high performance chip designs. Advanced technologies usually offer two types of back end of line (BEOL) capacitors, a plane high capacitance density MIM capacitor at higher metal, and metal finger arrays which provides a low capacitance density. A plane high capacitance density MIM capacitor has planar metal plates with a high-k dielectric thin film (such as HfO2, Al2O3, ZrO2, Ta2O5, or a combination) sandwiched between the planar metal plates. The plane high capacitance density MIM capacitor is built between two different metal wire levels. A metal finger array MIM capacitors include an array of parallel metal lines from the same metal wire level. These parallel metal lines serve as electrodes, and the inter-line dielectric (ILD) (usually a low k or a silicon-based oxide) between the metal lines serves as insulator layer for the capacitor. For some high performance devices, e.g. SRAM, there is a need for "local" decoupling capacitors to boost performance and yield. Metal finger array MIM capacitors have a capacitance density which is too low, and would need a large area of the chip to increase the capacitance. A local capacitor, near electronic components of the chip is preferred, such as a MIM capacitor.

A MIM capacitor may include an outer plate and an inner plate or electrode, with an insulator between the outer plate and the inner plate. The outer plate and the inner plate each may be referred to as a metal layer and alternatively each may be referred to as an electrode. There may be a first contact and a first via connected to the outer plate and a second via and a second contact may be connected to the inner plate. The first via and the second via may each connect between Mx metal lines, for example between Mx−1 metal line and Mx metal line. A MIM capacitor may have two or more plates. For example, there may be two outer plates surrounding an inner plate. There may be two outer plates alternating with two inner plates.

Following is a traditional embodiment of a three layer MIM capacitor. A bottom metal layer of an outer plate may be formed. A portion of the bottom metal layer may be removed, creating a first opening, or a first window. The first window may be referred to as a first contact slot. The first opening may have a square or rectangular shape from a top view. A first dielectric layer, or a first insulator layer may be conformally formed on the bottom metal layer and in the first opening. The first dielectric may be part of the insulator layer of the MIM capacitor. A middle metal layer may be conformally formed on the first dielectric layer. The middle metal layer may be an inner plate of the MIM capacitor. A portion of the middle metal layer of the outer plate may be removed, creating a second opening, or a second window. The second opening may have a square or rectangular shape from a top view. The second opening may be referred to as a second contact slot. A second dielectric layer, or a second insulator layer, may be conformally formed on the middle metal layer and in the second opening. The second dielectric layer may be part of the insulator layer of the MIM capacitor. A top metal layer may be formed. A portion of the top metal layer may be removed, creating a third opening, or a third window. The third opening may have a square or rectangular shape from a top view. The third opening may be vertically aligned above the first opening.

A first via may be formed through the bottom metal layer and the top metal layer, forming a first contact to the outer plate, where the outer plate is the bottom metal layer and the top metal layer. The first via may be formed in a first contact window where the first window and the third window are vertically aligned. The first dielectric separates the bottom metal layer from the middle metal layer. The second dielectric separates the middle metal layer from the top metal layer. A second via may be formed through the middle metal layer, forming a second contact to the inner plate, where the inner plate is the middle metal layer. The second via may be formed in a second contact window where the second opening is.

There are reliability concerns with the current method of formation of a MIM capacitor. Portions of the bottom metal layer are removed for the second contact opening. The first insulator and the inner metal layer are formed, they are conformally formed over the second contact opening. This results in the first insulator and the inner metal layer being formed with "steps", or surfaces which have more than one level and have sharp edges. The steps, or edges, where the surfaces change heights at approximately a ninety-degree angle are reliability concerns. Similarly, portions of the inner metal layer are removed for the first contact opening. The second insulator and the middle metal layer are conformally formed over the first contact opening. The inner metal layer, the second insulator and the middle metal layer are formed with "steps", as described above with similar reliability concerns.

Reliability concerns include electromigration failure and time-zero short/time dependent dielectric breakdown (hereinafter "TDDB") failure. Formation of the MIM capacitor with traditional methods of formation may have non-conformal electrode metal and insulators, which can lead to electrode pinch-off, resulting in electromigration failure and insulator pinch-off, which can cause a time-zero short/TBBD failure.

Non-conformal electrode metal and insulators, which means the metal layers and the insulators have a systematic thickness or property weakness spot or significant variation at specific location. Electrode pinch-off means the metal layer thickness is significantly thinner at certain location results in discontinuous metal layers. This can lead to electromigration failure due to insufficient conductive area for electron flow.

Insulator pinch-off means an insulator layer thickness is significantly thinner at certain location results in metal layers shorting. This can lead to time-zero short, which means two or more than two conductive metals in different electrical polarities are connected. This can also lead to TBBD failure due to insufficient isolation of two or more than two conductive metals with different electrical polarities.

In this invention, the MIM capacitor may be formed which will eliminate formation of the bottom metal layer, the middle metal layer, the inner metal layer, the first insulator and the second insulator with "steps" or sharp edges of approximately ninety degrees. This will reduce MIM capacitor electrode and high-k coverage weakness and also improve MIM capacitor electromigration, TDDB, Vmax and time-zero short, all of which are significantly valuable for improved performance.

Vmax is a maximum voltage can be applied in a system while meeting a requirement usage, a requirement usage such as a size of a circuit and a duration of ten years. A Vmax is projected during TDDB reliability stressing. An improved TDDB reliability will result in an improved Vmax, which is a higher Vmax.

With the advanced MIM capacitor designs, such as a greater than two plate MIM capacitor and a thinner high-k insulator layer, metal step control becomes more important to achieve reliability requirements. Current embodiments are based on a three plate MIM capacitor, which is three metal layers and two insulator films between each metal layer. For increasing a capacitance of the MIM capacitor, there is a trend to increasing a number of layers of the MIM capacitor, with more metal layers and more layers of insulator film between each metal layer. The thinner high-k insulator film thickness occurs at corners of the metal layers.

In this invention, a bottom metal layer of an outer plate may be formed. A portion of the bottom metal layer may be removed, creating a first opening, or a first contact window. The first contact window may be referred to as a first contact slot. The first contact window may have shape of a square, a rectangle, a circle, an oval, or other polygon shape, from a top view. A first dielectric may be conformally formed on the bottom metal layer and in the first contact window. Portions of the first dielectric may be removed such that remaining portions of the first dielectric cover vertical sidewalls of the bottom metal layer, creating a curved, rounded or sloped edge. The remaining portions of the first dielectric are disposed within the first contact window on vertical sidewalls of the bottom metal layer as a first dielectric spacer. A first insulator may be formed on the first dielectric spacer and the bottom metal layer. The first insulator will not have steps or sharp edges. The first insulator is part of the insulator layer of the MIM capacitor.

A middle metal layer may be conformally formed on the first dielectric layer. The middle metal layer will not have steps or sharp edges. The middle metal layer may be an inner plate of the MIM capacitor. A portion of the middle metal layer may be removed, creating a second opening, or a second window. The second contact window may have shape of a square, a rectangle, a circle, an oval, or other polygon shape, from a top view. The second contact window may be referred to as a second contact slot. A second dielectric may be conformally formed on the middle metal layer and in the second contact window. Portions of the second dielectric may be removed such that remaining portions of the second dielectric cover vertical sidewalls of the middle metal layer, creating a curved, rounded or sloped edge, as a second dielectric liner. The remaining portions of the second dielectric are disposed within the second contact window on vertical sidewalls of the middle metal layer as a second dielectric spacer. A second insulator may be formed on the second dielectric spacer and the middle metal layer. The second insulator will not have steps or sharp edges. The first insulator and the second insulator are the insulator layer of the MIM capacitor.

A top metal layer may be formed. The top metal layer will not have steps or sharp edges. A portion of the top metal layer may be removed, creating a third opening, or a third contact window. The third contact window may have shape of a square, a rectangle, a circle, an oval, or other polygon shape, from a top view. The third contact window may be vertically aligned above the first opening. A third dielectric layer may be conformally formed on the top metal layer and in the third contact window.

A first via may be formed through the bottom metal layer and the top metal layer, forming a first contact to the outer plate, where the outer plate is the bottom metal layer and the top metal layer. The first via may be formed in a first contact window where the first contact window and the third contact window are vertically aligned. A second via may be formed through the middle metal layer, forming a second contact to the inner plate, where the inner plate is the middle metal layer. The second via may be formed in a second contact window where the second opening is.

This invention may be applied to any number of layers of metal plates and insulators between the metal plates.

This invention provides insulator layers and metal layers which do not have steps, or sharp edge surface, and metal plates are enclosed on vertical side surfaces by a dielectric.

This invention provides a MIM capacitor with improved reliability due to metal layers with dielectric surrounding vertical side surfaces of the metal layers and insulators formed on curved, rounded or sloped edges, where the insulator and the metal layers do not fill in sharp vertical side surfaces.

The present invention relates, generally, to the field of semiconductor manufacturing, and more particularly to a metal-insulator-metal (MIM) capacitor.

Figure 2:
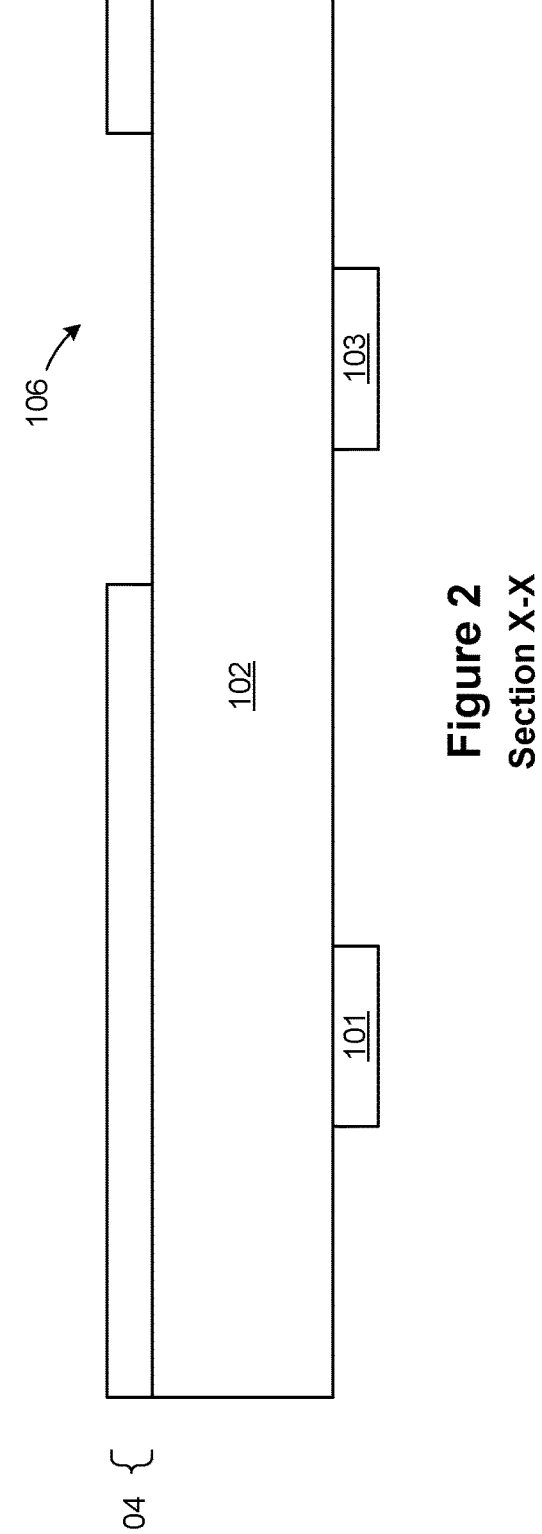
FIG. 2 illustrates a cross-sectional view of the semiconductor structure according to FIG. 1, along section line X-X, according to an exemplary embodiment.

Referring now to FIGS. 1 and 2, a semiconductor structure 100 (hereinafter "structure") at an intermediate stage of fabrication is shown according to an exemplary embodiment. FIG. 1 is a top view of the structure 100. FIG. 2 is a cross-sectional view of the structure 100 along section line X-X. The structure 100 may be formed or provided. The structure 100 may include an Mx−1 metal line 101, an Mx−1 metal line 103, an inter-layer dielectric (hereinafter "ILD") 102 and a bottom metal layer 104.

The structure 100 may include several back end of line ("BEOL") layers. In general, the back end of line (BEOL) is where individual devices (transistors, capacitors, resistors, etc.) are interconnected with wiring on a semiconductor wafer or substrate.

The Mx−1 metal line 101 and the Mx−1 metal line 103 may each be composed of, for example, tantalum nitride (TaN), tantalum (Ta), titanium (Ti), titanium nitride (TiN), cobalt (Co) or a combination thereof. There may be any number of Mx−1 metal lines 101 and Mx−1 metal lines 103, on the structure 100. The Mx−1 metal line 101 and the Mx−1 metal line 103 may be formed by methods known in the arts.

The ILD 102 may be formed by depositing or growing a dielectric material on the BEOL layers, followed by a chemical mechanical polishing (CMP) or etch steps. The ILD 102 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the ILD 102 may include one or more layers. In an embodiment, the ILD 102 may include any dielectric material such as tetraethyl orthosilicate (TEOS), silicon oxide (SiOx), silicon nitride (SiNx), silicon boron carbonitride (SiBCN), NBLoK, a low-k dielectric material (with k<4.0) such as SiCOH, SiCNH and SiCNOH, including but not limited to, silicon oxide, spin-on-glass, a flowable oxide, a high-density plasma oxide, borophosphosilicate glass (BPSG), or any combination thereof or any other suitable dielectric material. NBLoK is a trademark of Applied Materials, Inc.

The bottom metal layer 104 may be formed from a conductive material layer which is blanket deposited on top of the structure 100, and directly on an upper horizontal surface of the ILD 102. The conductive material layer may include materials such as, for example titanium nitride (TiN), tantalum nitride (TaN). The conductive material can be formed by for example, chemical vapor deposition (CVD), physical vapor deposition (PVD), and atomic layer deposition (ALD) or a combination thereof.

A contact window 106 may be formed by removal of portions of the bottom metal layer 104, exposing an upper horizontal surface of the ILD 102, by selective etching, such as reactive etching (RIE). In an embodiment, the contact window 106 may have a rectangular shaped outline when viewed from the top view of FIG. 1. The contact window 106 may be vertically aligned above the Mx–1 metal line 103.

Figure 3:
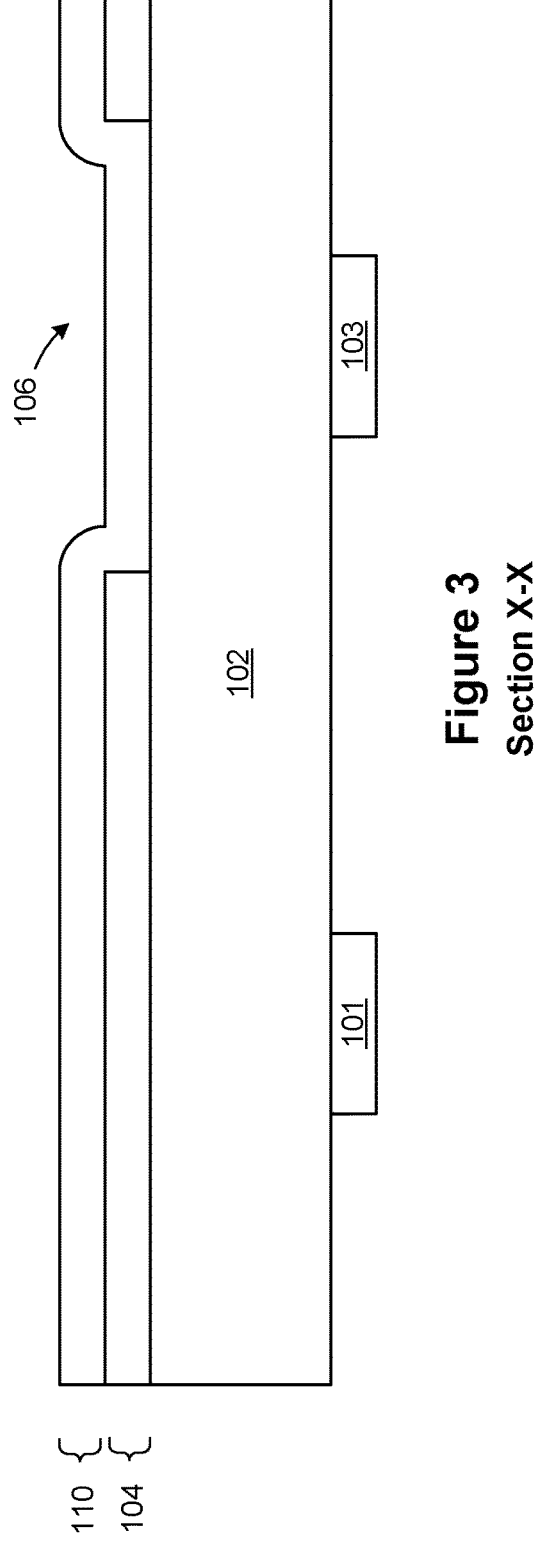
FIG. 3 illustrates a cross-sectional view of the semiconductor structure along section line X-X and illustrates formation of a dielectric, according to an exemplary embodiment.

Referring now to FIG. 3, the structure 100 is shown according to an exemplary embodiment. FIG. 3 is a cross-sectional view of the structure 100 along section line X-X. A dielectric spacer 110 may be formed.

The dielectric spacer 110 may be conformally deposited on the structure 100. The dielectric spacer 110 may be formed on the bottom metal layer 104 and on the ILD 102, and fill a portion of the contact window 106.

The dielectric spacer 110 may be formed by depositing or growing a dielectric material, followed by a chemical mechanical polishing (CMP) or etch steps. The dielectric spacer 110 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the ILD 102 may include one or more layers. In an embodiment, the dielectric spacer 110 may include any dielectric material such as tetraethyl orthosilicate (TEOS), silicon oxide (SiOx), silicon nitride (SiNx), silicon boron carbonitride (SiBCN), NBLoK, a low-k dielectric material (with k<4.0) such as SiCOH, SiCNH and SiCNOH, including but not limited to, silicon oxide, spin-on-glass, a flowable oxide, a high-density plasma oxide, borophosphosilicate glass (BPSG), or any combination thereof or any other suitable dielectric material. NBLoK is a trademark of Applied Materials, Inc.

Figure 4:
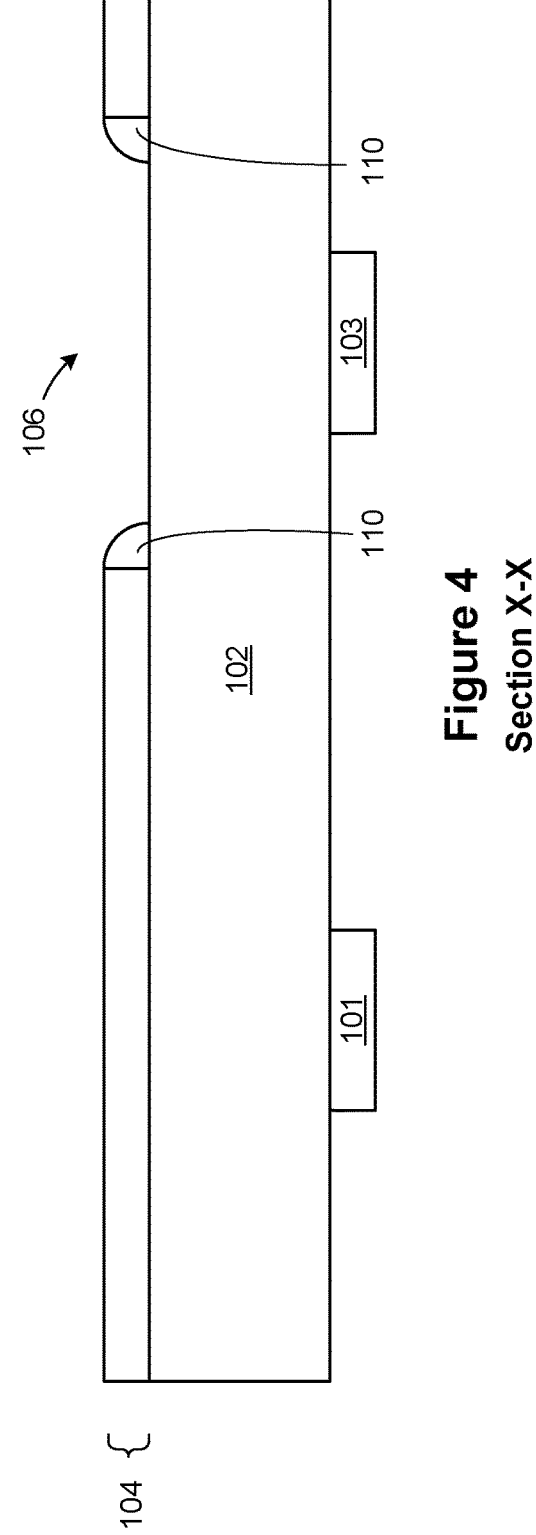
FIG. 4 illustrates a cross-sectional view of the semiconductor structure along section line X-X and illustrates removal of portions of the dielectric, according to an exemplary embodiment.

Referring now to FIG. 4, the structure 100 is shown according to an exemplary embodiment. FIG. 4 is a cross-sectional view of the structure 100 along section line X-X. Portions of the dielectric spacer 110 may be removed, increasing the contact window 106.

The portions of the dielectric spacer 110 may be removed from upper horizontal surfaces of the bottom metal layer 104 and of the ILD 102. Remaining portions of the dielectric spacer 110 may cover a vertical side surface of the bottom metal layer 104 and a portion of an upper horizontal surface of the ILD 102. The portions of the dielectric spacer 110 may be removed by a combination of wet/dry processes by methods known in the arts.

The remaining portions of the dielectric spacer 110 may have a rounded upper surface and may provide a buffer to a steep or stepped sharp edge of the bottom metal layer 104 in the contact window 106. The dielectric spacer 110 has a first height adjacent to a vertical side surface of the bottom metal layer 104 which is equal to a height of the bottom metal layer 104, when measured from an upper surface of the ILD 102. The dielectric spacer 110 slopes downwards toward a center of the contact window 106 and has a height of zero in a center of the contact window 106.

Figure 5:
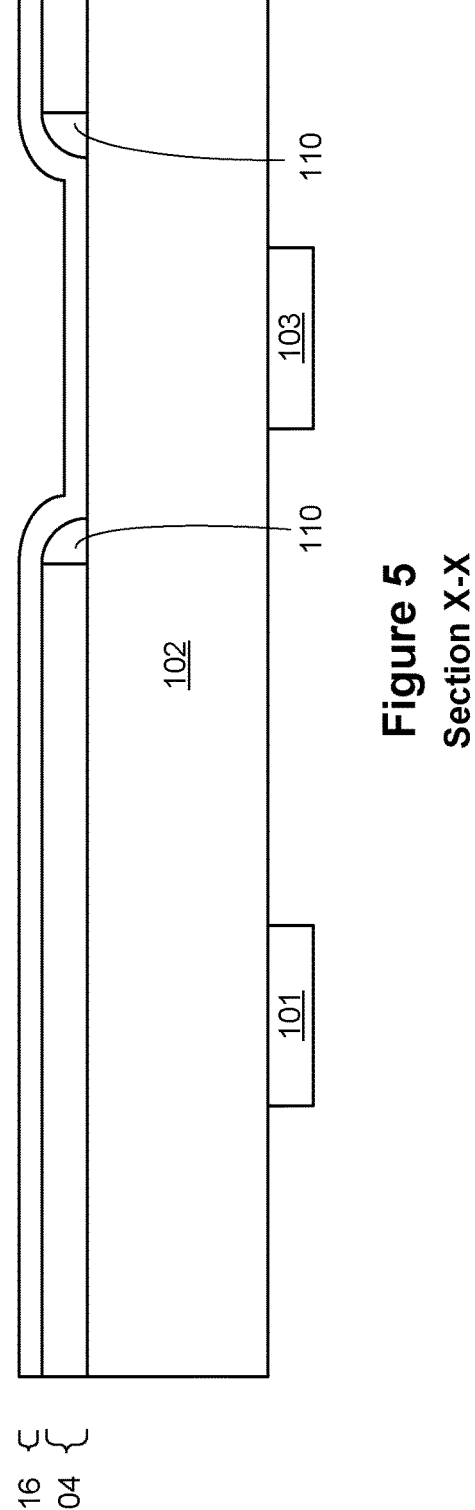
FIG. 5 illustrates a cross-sectional view of the semiconductor structure along section line X-X, and illustrations formation of a first insulator, according to an exemplary embodiment.

Referring now to FIG. 5, the structure 100 is shown according to an exemplary embodiment. FIG. 5 is a cross-sectional view of the structure 100 along section line X-X. A first insulator 116 may be formed.

The first insulator 116 may be conformally deposited on the bottom metal layer 104, the ILD dielectric spacer 110 and the ILD 102. The first insulator 116 may be deposited using typical deposition techniques, for example, atomic layer deposition (ALD), molecular layer deposition (MLD), chemical vapor deposition (CVD), physical vapor deposition (PVD), high density plasma (HDP) deposition. In an embodiment, the first insulator 116 may include any high-k dielectric and may include, but is not limited to $HfO_2$, $ZrO_2$, $La_2O_5$, $Al_2O_3$, $TiO_2$, a high-k dielectric material (with k>4.0), or a combination thereof.

A bottom most surface of the bottom metal layer 104 is substantially flush with a bottom most surface of the first insulator 116.

Figure 6:
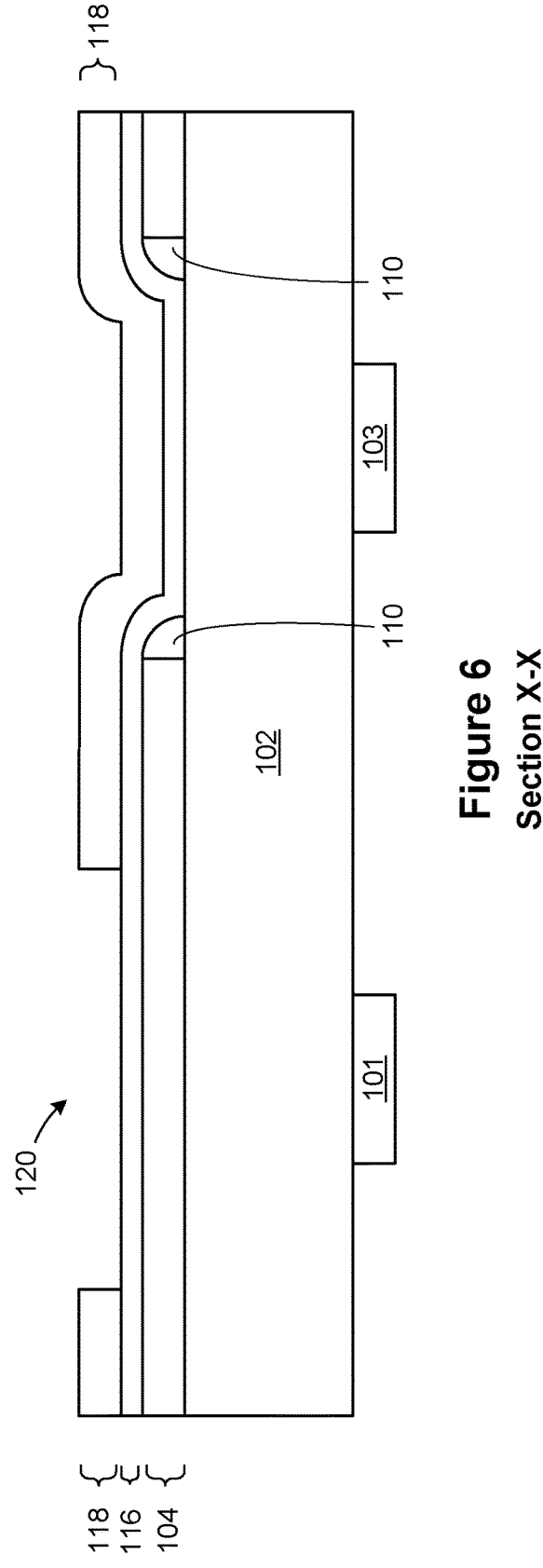
FIG. 6 illustrates a cross-sectional view of the semiconductor structure along section line X-X, and illustrations formation of a middle metal layer, according to an exemplary embodiment.

Referring now to FIG. 6, the structure 100 is shown according to an exemplary embodiment. FIG. 6 is a cross-sectional view of the structure 100 along section line X-X. A middle metal layer 118 may be formed.

The middle metal layer 118 may be formed from a conductive material layer which is blanket deposited on top of the structure 100, and directly on an upper horizontal surface of the first insulator 116. The conductive material layer may include materials such as, for example titanium nitride (TiN), tantalum nitride (TaN), copper (Cu), ruthenium (Ru), cobalt (Co), tungsten (W). The conductive material can be formed by for example, chemical vapor deposition (CVD), physical vapor deposition (PVD), and atomic layer deposition (ALD) or a combination thereof.

A contact window 120 may be formed by removal of portions of the middle metal layer 118, exposing an upper horizontal surface of the first insulator 116, by selective etching, such as reactive etching (RIE). In an embodiment, the contact window 120 may have a rectangular shaped outline when viewed from a top view. In an alternate embodiment, the contact window 120 may have circular outline, an oval outline or a polygonal outline.

The contact window 120 may be vertically aligned above the Mx–1 metal line 101.

Figure 7:
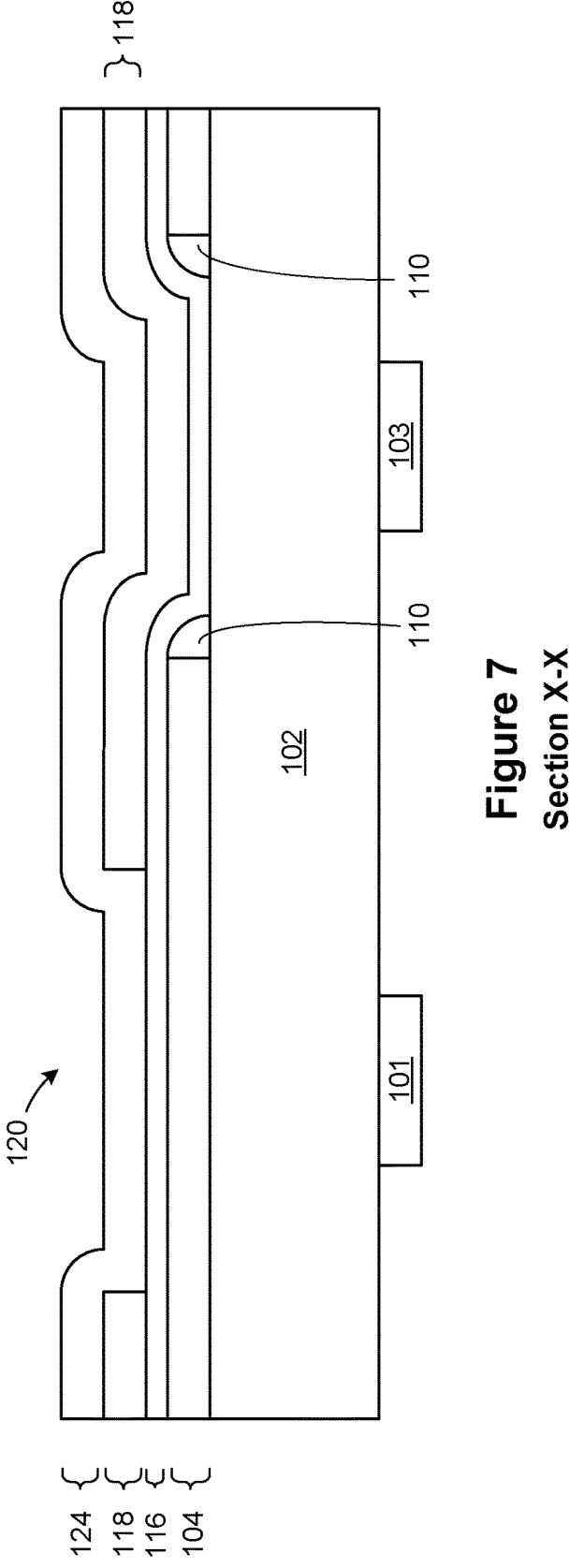
FIG. 7 illustrates a cross-sectional view of the semiconductor structure along section line X-X, and illustrates formation of a second dielectric, according to an exemplary embodiment.
Figure 7:

Referring now to FIG. 7, the structure 100 is shown according to an exemplary embodiment. FIG. 7 is a cross-sectional view of the structure 100 along section line X-X. A dielectric spacer 124 may be formed.

The dielectric spacer 124 may be conformally deposited on the structure 100. The dielectric spacer 124 may be formed on the middle metal layer 118 and on the first insulator 116, and partially fill the contact window 120. The dielectric spacer 124 may be formed as described for the dielectric spacer 110.

A bottom most surface of the middle metal layer 118 is substantially flush with a bottom most surface of the second insulator 124.

Figure 8:
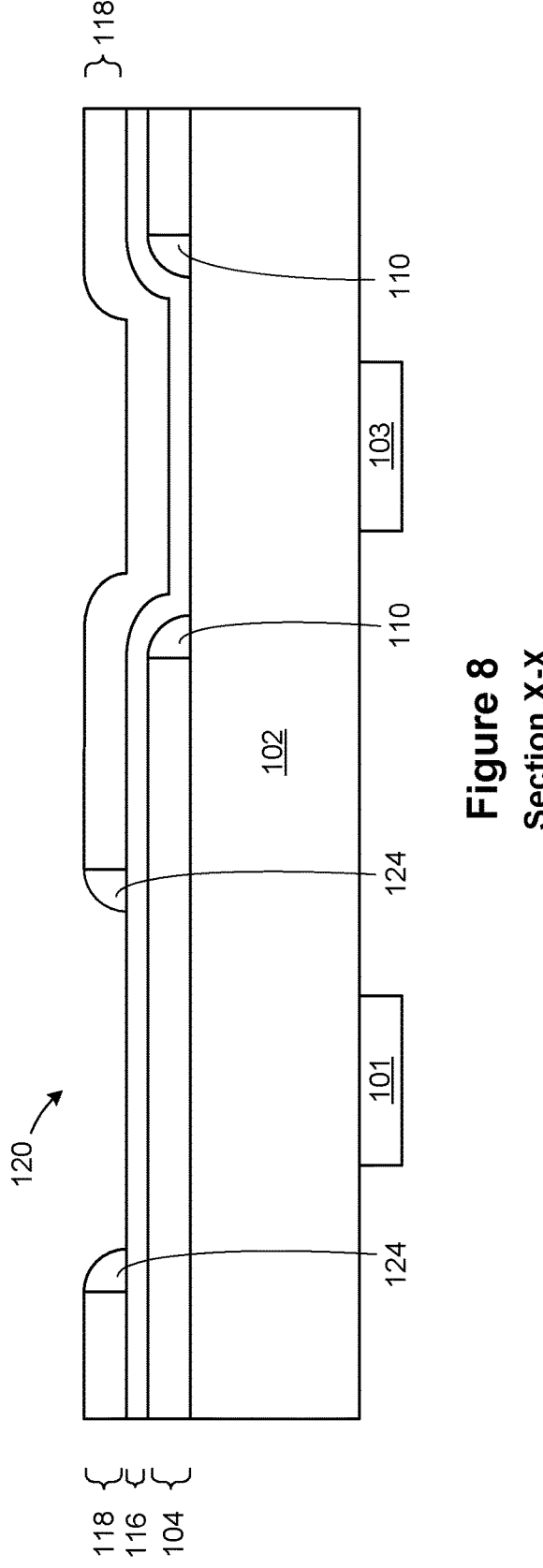
FIG. 8 illustrates a cross-sectional view of the semiconductor structure along section line X-X and illustrates removal of portions of the second dielectric, according to an exemplary embodiment.

Referring now to FIG. 8, the structure 100 is shown according to an exemplary embodiment. FIG. 8 is a cross-sectional view of the structure 100 along section line X-X. Portions of the dielectric spacer 124 may be removed.

The portions of the dielectric spacer 124 may be removed from upper horizontal surfaces of the middle metal layer 118 and the first insulator 116. Remaining portions of the dielectric spacer 124 may cover a vertical side surface of the first insulator 116. The portions of the dielectric spacer 124 may be removed by a combination of wet/dry processes by methods known in the arts, increasing the contact window 120.

The remaining portions of the dielectric spacer 124 may have a rounded upper surface and may provide a buffer to a steep or stepped sharp edge of the middle metal layer 118 in the contact window 120. The dielectric spacer 124 has a first height adjacent to a vertical side surface of the metal layer 118 which is equal to a height of the middle metal layer 118, when measured from an upper surface of the ILD 102. The dielectric spacer 124 slopes downward toward a center of the contact window 120 and has a height of zero in a center of the contact window 120.

Referring now to FIG. 9, the structure 100 is shown according to an exemplary embodiment. FIG. 9 is a cross-sectional view of the structure 100 along section line X-X. A second insulator 130 may be formed.

The second insulator 130 may be deposited on upper horizontal surfaces of the middle metal layer 118 and the first insulator 116. The insulator may be deposited on the dielectric spacer 124. The second insulator 130 may be deposited using typical deposition techniques, for example, atomic layer deposition (ALD), molecular layer deposition (MLD), chemical vapor deposition (CVD), physical vapor deposition (PVD), high density plasma (HDP) deposition. In an embodiment, the second insulator 130 may include any high-k dielectric and may include, but is not limited to $HfO_2$, $ZrO_2$, $La_2O_5$, $Al_2O_3$, $TiO_2$, a high-k dielectric material (with k>4.0), or a combination thereof.

Referring now to FIG. 10, the structure 100 is shown according to an exemplary embodiment. FIG. 10 is a cross-sectional view of the structure 100 along section line X-X. A top metal layer 132 may be formed.

The top metal layer 132 may be formed from a conductive material layer which is blanket deposited on top of the structure 100, and directly on an upper horizontal surface of the second insulator 130. The conductive material layer may include materials such as, for example titanium nitride (TiN), tantalum nitride (TaN). The conductive material can be formed by for example, chemical vapor deposition (CVD), physical vapor deposition (PVD), and atomic layer deposition (ALD) or a combination thereof.

A contact window 136 may be formed by removal of portions of the top metal layer 132, exposing an upper horizontal surface of the second insulator 130, by selective etching, such as reactive etching (RIE). In an embodiment, the contact window 136 may have a rectangular shaped outline when viewed from a top view of the structure 100. In an alternate embodiment, the contact window 136 may have circular outline, an oval outline or a polygonal outline. The contact window 136 may be vertically aligned above the Mx−1 metal line 103.

Figure 11:
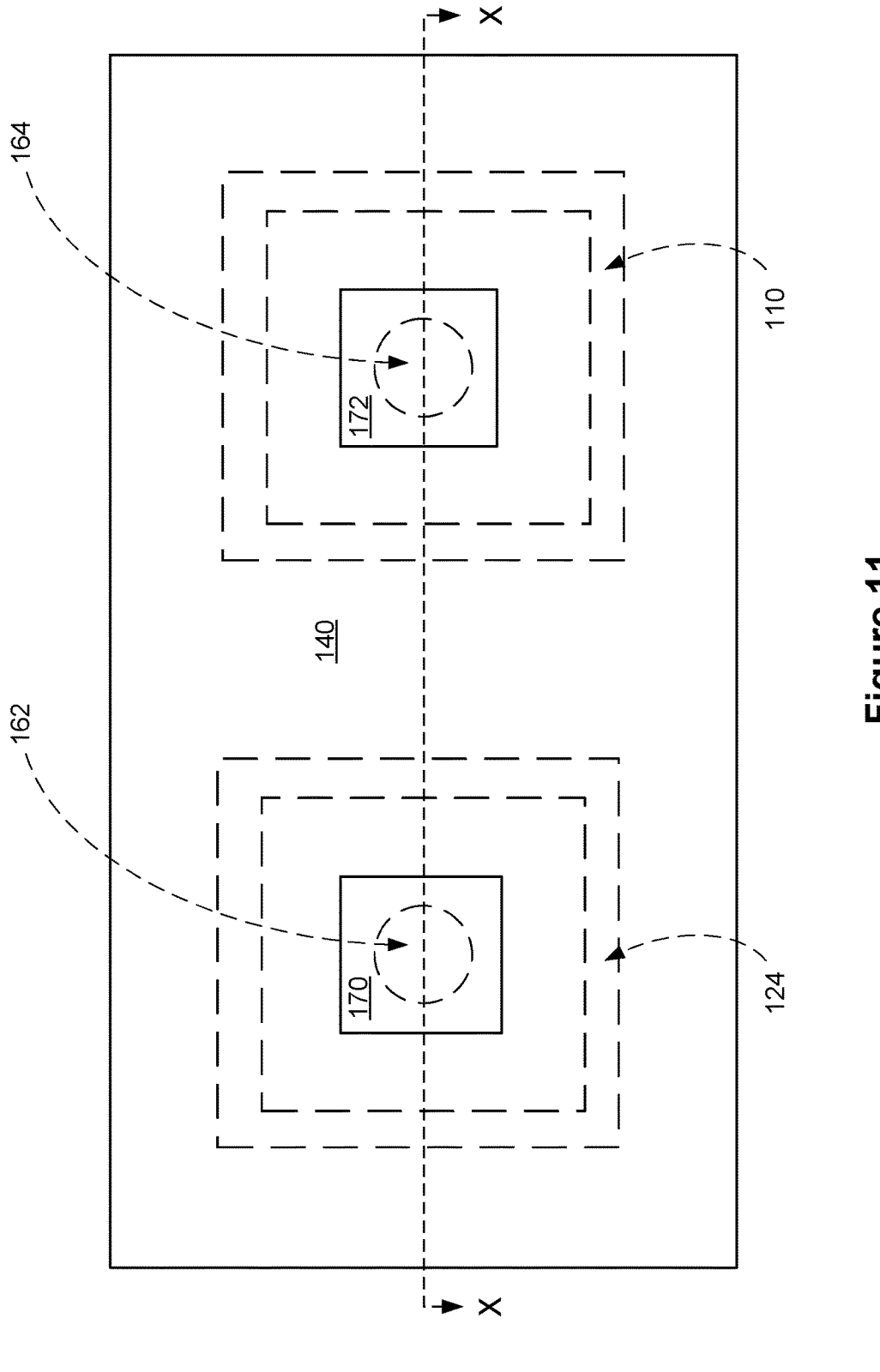
FIG. 11 illustrates a top view of the semiconductor structure, along section line X-X, according to an exemplary embodiment.
Figure 12:
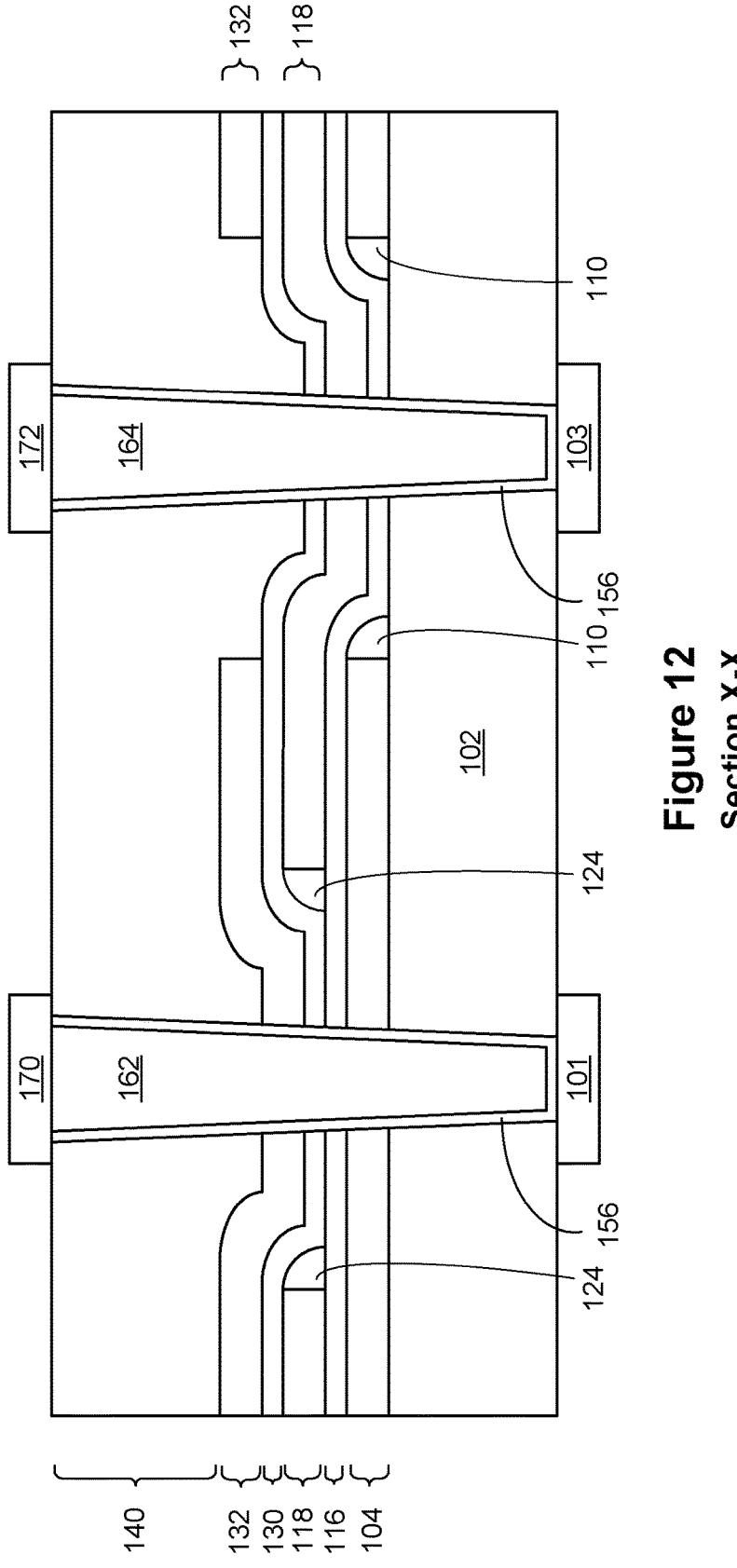
FIG. 12 illustrates a top view of the semiconductor structure according to FIG. 11, and illustrations formation of an inter-layer dielectric and formation of a via, according to an exemplary embodiment.

Referring now to FIGS. 11 and 12, the semiconductor structure 100 (hereinafter "structure") is shown according to an exemplary embodiment. FIG. 11 is a top view of the structure 100. FIG. 12 is a cross-sectional view of the structure 100 along section line X-X. An inter-layer dielectric (hereinafter "ILD") 140 may be formed. A liner 156, a via 162, a via 164, an Mx metal line 170 and an Mx metal line 172 may be formed.

The dashed lines of the dielectric spacer 110, the dielectric spacer 124, the via 162 and the via 164 indicate these structures are below an upper surface of the top view of the structure 100 shown in FIG. 11. The dielectric spacer 110 and the dielectric spacer 124 each are illustrated as an outline of a rectangular shape from the top view of FIG. 11. The dielectric spacer 110 and the dielectric spacer 124 may each have an outline of a circle, an oval or any polygon shape when viewed from above. The dielectric spacer 110 and the dielectric spacer 124 may each have an outline which follows a shape of a window, an opening or a slot for each respective outer plate, inner plate.

The ILD 140 may be conformally deposited on the structure 100. The ILD 140 may be formed as described for the ILD 102. The ILD 140 may be formed on the top metal layer 132 and on the second insulator 130, and fill the contact window 136.

A planarization process, such as, for example, chemical mechanical polishing (CMP), may be done to remove excess material from an upper horizontal surface of the structure 100 such that an upper horizontal surfaces of the ILD 140 is planar.

A first opening (not shown) may be formed in the structure 100. The first opening (not shown) may be formed by removal of vertically aligned portions of the ILD 140, the top metal layer 132, the second insulator 130, the first insulator 116, the bottom metal layer 104, and the ILD 102, exposing an upper horizontal surface of the Mx−1 metal line 101.

A second opening (not shown) may be formed in the structure 100. The second opening (not shown) may be formed by removal of vertically aligned portions of the ILD 140, the second insulator 130, the middle metal layer 118, the first insulator 116 and the ILD 102, exposing an upper horizontal surface of the Mx−1 metal line 103.

The liner 156 may be formed in the first opening (not shown). The liner 156 may be formed along vertical side surfaces and lower horizontal surfaces of the first opening (not shown), on vertical side surfaces of the ILD 140, the top metal layer 132, the second insulator 130, the first insulator 116, the bottom metal layer 104 and the ILD 102. The liner 156 may be formed on horizontal upper surfaces of the Mx−1 metal line 101.

The liner 156 may be formed in the in the second opening (not shown). The liner 156 may be formed along vertical side surfaces and lower horizontal surfaces of the second opening (not shown), on vertical side surfaces of the ILD 140, the second insulator 130, the middle metal layer 118, the first insulator 116 and the ILD 102. The liner 156 may be formed on horizontal upper surfaces of the Mx−1 metal line 103.

The liner 156 may be composed of, for example, tantalum nitride (TaN), tantalum (Ta), titanium (Ti), titanium nitride (TiN), cobalt (Co) or a combination thereof. The liner 156 may be deposited by a conventional deposition process such as, for example, CVD, plasma enhanced chemical vapor deposition (PECVD), PVD or ALD. The liner 156 may be 5 nm thick, although a thickness less than or greater than 5 nm may be acceptable.

In an embodiment, the via 162 and the via 164 are formed from a conductive material layer which is blanket deposited on top of the structure 100, and directly on an upper horizontal surface of the ILD 140, and directly on a top surface of the liner 156, filling the first opening (not shown) and the second opening (not shown). The conductive material layer may include materials such as, for example, copper (Cu), ruthenium (Ru), cobalt (Co), aluminum (Al), tungsten (W), tantalum nitride (TaN) and titanium nitride (TiN). The conductive material can be formed by for example, electrochemical plating, chemical vapor deposition (CVD), physical vapor deposition (PVD), and atomic layer deposition (ALD) or a combination thereof. The via 162 and the via 164 are formed by damascene, or patterned from the conductive material layer, using known patterning and etching techniques. There may be any number of openings in the structure 100, each filled with the liner 156 and the via 162 and the via 164.

A planarization process, such as, for example, chemical mechanical polishing (CMP), may be done to remove excess material from an upper horizontal surface of the structure 100 such that upper horizontal surfaces of the via 162 and the via 164, the liner 156 and the ILD 140 are coplanar.

The Mx metal line 170 and the Mx metal line 172 may be formed as described for the Mx−1 metal line 101 and the Mx−1 metal line 103. There may be any number of Mx metal lines 170 and Mx metal lines 172 on the structure 100.

The top metal layer 132 and the bottom metal layer 104 form the outer plate of the MIM capacitor. The first insulator 116 and the second insulator 130 form the insulator of the MIM capacitor. The middle metal layer 118 is the inner plate of the MIM capacitor. The outer plate, the insulator and the inner plate form the MIM capacitor. The via 162 is a contact to the outer plate of the MIM capacitor. The via 162 is connected to the Mx−1 metal line 101 and to the Mx metal line 170. The via 164 is a contact to the inner plate of the MIM capacitor. The via 164 is connected to the Mx−1 metal line 101 and to the Mx metal line 172.

The MIM capacitor layers of the outer plate, the insulator and the inner plate each have an upper horizontal surface and a lower horizontal surface with no 'steps' or sharp edges, due to the dielectric spacer 124 and the dielectric spacer 110.

The dielectric spacer 110 and the dielectric spacer 124 have an outline of a rectangular shape when viewed from above. In other embodiments, the dielectric spacer 110 and the dielectric spacer 124 may have an outline of a different shape, such as a circle, an oval, or other polygon shape. The dielectric spacer 110 and the dielectric spacer 124 provide a curved, rounded or slanted surface for subsequent layer formation, reducing sharp edges or steps for the subsequent layer formation.

The structure 100 provides a MIM capacitor with improved reliability due to metal layers (the bottom metal layer 104, the middle metal layer 118) surrounded on vertical side surfaces with the (dielectric spacer 110, the dielectric spacer 124) and the insulator layers (the first insulator 116, the second insulator 130), each having smoother edges of surfaces.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A metal insulator metal capacitor (MIM capacitor) comprising:
   a bottom metal layer on a substrate;
   a first contact window in the bottom metal layer;
   a first dielectric spacer disposed within the first contact window on vertical sidewalls of the bottom metal layer, wherein the first dielectric spacer has a rounded upper surface;
   a first insulator layer on the bottom metal layer and on the first dielectric spacer, wherein the first insulator layer conforms to a rounded profile of the first dielectric spacer,
   a middle metal layer on the first insulator layer;
   a second insulator layer on the middle metal layer; and
   a top metal layer on the second insulator layer with a third contact window vertically aligned above the first contact window.

2. The MIM capacitor according to claim 1, wherein the first insulator layer comprises a different material than the first dielectric spacer.

3. The MIM capacitor according to claim 2, wherein the middle metal layer comprises a second contact window, and wherein the middle metal layer conforms to a rounded profile of the first insulator layer; and further comprising:
   a second dielectric spacer surrounding vertical side surfaces of the middle metal layer in the second contact window, wherein the second dielectric spacer has a rounded upper surface.

4. The MIM capacitor according to claim 3, wherein the second insulator layer is further on the second dielectric spacer, and wherein
   the second insulator layer conforms to a rounded profile of the middle metal layer and the second dielectric spacer, and wherein
   the second insulator layer comprises a different material than the second dielectric spacer.

5. The MIM capacitor according to claim 4, wherein the top metal layer conforms to a rounded profile of the second insulator layer; and further comprising:
   a first contact to the middle metal layer, wherein the first contact is through the third contact window and through the first contact window.

6. The MIM capacitor according to claim 5, further comprising:
   a second contact to the top metal layer and to the bottom metal layer, wherein the second contact is through the second contact window.

7. The MIM capacitor according to claim 1, wherein the first dielectric spacer comprises an outline of a rectangular shape from a top view.

8. A metal insulator metal capacitor (MIM capacitor) comprising:
   a bottom metal layer on a substrate;
   a first contact window in the bottom metal layer;
   a first dielectric spacer disposed within the first contact window on vertical sidewalls of the bottom metal layer, wherein the first dielectric spacer has a rounded upper surface,
   a first insulator layer on the bottom metal layer and on the first dielectric spacer, wherein the first insulator layer conforms to a rounded profile of the first dielectric spacer,
   a middle metal layer on the first insulator layer; and
   a second insulator layer on the middle metal layer; and a top metal layer on the second insulator layer with a third contact window vertically aligned above the first contact window; wherein a bottom most surface of the bottom metal layer is substantially flush with a bottom most surface of the first insulator layer.

9. The MIM capacitor according to claim 8, wherein the first insulator layer comprises a different material than the first dielectric spacer.

10. The MIM capacitor according to claim 9, wherein the middle metal layer comprises a second contact window, and wherein the middle metal layer conforms to a rounded profile of the first insulator layer; and further comprising:

a second dielectric spacer surrounding vertical side surfaces of the middle metal layer in the second contact window, wherein the second dielectric spacer has a rounded upper surface.

11. The MIM capacitor according to claim 10, wherein the second insulator layer is further on the second dielectric spacer, and wherein the second insulator layer conforms to a rounded profile of the middle metal layer and the second dielectric spacer, and wherein the second insulator layer comprises a different material than the second dielectric spacer.

12. The MIM capacitor according to claim 11, wherein the top metal layer conforms to a rounded profile of the second insulator layer; and further comprising:

a first contact to the middle metal layer, wherein the first contact is through the third contact window and through the first contact window.

13. The MIM capacitor according to claim 12, further comprising:

a second contact to the top metal layer and to the bottom metal layer, wherein the second contact is through the second contact window.

14. The MIM capacitor according to claim 8, further comprising:

the first dielectric spacer comprises an outline of a rectangular shape from a top view.

15. A method of forming a metal insulator metal capacitor (MIM capacitor) comprising:

forming a bottom metal layer on a substrate;

forming a first contact window in the bottom metal layer;

forming a first dielectric spacer disposed within the first contact window on vertical sidewalls of the bottom metal layer, wherein the first dielectric spacer has a rounded upper surface;

forming a first insulator layer on the bottom metal layer and on the first dielectric spacer, wherein the first insulator layer conforms to a rounded profile of the first dielectric spacer, forming a middle metal layer on the first insulator layer;

forming a second insulator layer on the middle metal layer; and forming a top metal layer on the second insulator layer with a third contact window vertically aligned above the first contact window.

16. The method according to claim 15, wherein the first insulator layer comprises a different material than the first dielectric spacer.

17. The method according to claim 16, wherein the middle metal layer comprises a second contact window, and wherein the middle metal layer conforms to a rounded profile of the first insulator layer; and further comprising:

forming a second dielectric spacer surrounding vertical side surfaces of the middle metal layer in the second contact window, wherein the second dielectric spacer has a rounded upper surface.

18. The method according to claim 17, wherein the second insulator layer is further formed on the second dielectric spacer, and wherein the second insulator layer conforms to a rounded profile of the middle metal layer and the second dielectric spacer, wherein the second insulator layer comprises a different material than the second dielectric spacer.

19. The method according to claim 18, wherein the top metal layer conforms to a rounded profile of the second insulator layer; and further comprising:

forming a first contact to the middle metal layer, wherein the first contact is through the third contact window and through the first contact window.

20. The method according to claim 15, wherein a bottom most surface of the bottom metal layer is substantially flush with a bottom most surface of the first insulator layer.

* * * * *